United States Patent
Torii

(10) Patent No.: US 9,466,485 B2
(45) Date of Patent: Oct. 11, 2016

(54) CONDUCTOR PATTERN FORMING METHOD, AND SEMICONDUCTOR DEVICE MANUFACTURING METHOD

(71) Applicant: CANON KABUSHIKI KAISHA, Tokyo (JP)

(72) Inventor: Keita Torii, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/564,622

(22) Filed: Dec. 9, 2014

(65) Prior Publication Data

US 2015/0162375 A1    Jun. 11, 2015

(30) Foreign Application Priority Data

Dec. 10, 2013 (JP) ................. 2013-255211

(51) Int. Cl.
| | |
|---|---|
| H01L 21/302 | (2006.01) |
| H01L 21/461 | (2006.01) |
| H01L 21/027 | (2006.01) |
| H01L 27/146 | (2006.01) |
| H01L 21/3213 | (2006.01) |
| H01L 21/311 | (2006.01) |

(52) U.S. Cl.
CPC ..... *H01L 21/0276* (2013.01); *H01L 21/31116* (2013.01); *H01L 21/31122* (2013.01); *H01L 21/31138* (2013.01); *H01L 21/32136* (2013.01); *H01L 21/32139* (2013.01); *H01L 27/14636* (2013.01); *H01L 27/14621* (2013.01); *H01L 27/14627* (2013.01); *H01L 27/14645* (2013.01); *H01L 27/14689* (2013.01)

(58) Field of Classification Search
None
See application file for complete search history.

(56) References Cited

U.S. PATENT DOCUMENTS

| | | | |
|---|---|---|---|
| 2006/0040502 | A1 | 2/2006 | Fukumizu |
| 2010/0000969 | A1* | 1/2010 | Hsu ............ H01L 21/31116 216/51 |
| 2014/0110373 | A1* | 4/2014 | Nishimura ......... C23F 1/02 216/47 |

FOREIGN PATENT DOCUMENTS

| | | |
|---|---|---|
| JP | 7-235539 A | 9/1995 |
| JP | 2007-081383 A | 3/2007 |

* cited by examiner

*Primary Examiner* — Sonya D McCall Shepard
(74) *Attorney, Agent, or Firm* — Canon U.S.A., Inc. IP Division

(57) ABSTRACT

A conductor pattern forming method includes forming, on a conductor film, a laminated film including a first layer thinner than the conductor film, a second layer thicker than the first layer, and a third layer thinner than the second layer, which layers are laminated in order from the conductor film side. A first mask is formed from the third layer by dry-etching the third layer using a photoresist mask formed on the laminated film. A second mask is formed from the second layer by dry-etching the second layer using the first mask. The conductor film is exposed by dry-etching the first layer using the second mask. A conductor pattern is formed from the conductor film by dry-etching the conductor film using the second mask.

18 Claims, 2 Drawing Sheets

CONDUCTOR PATTERN FORMING METHOD, AND SEMICONDUCTOR DEVICE MANUFACTURING METHOD

BACKGROUND OF THE INVENTION

1. Field of the Invention

The present disclosure relates to a method of forming a conductor pattern using an etching mask.

2. Description of the Related Art

Wiring in electronic devices such as semiconductor devices or display devices typically includes a conductor pattern formed by patterning of a conductor film by etching. As the technology develops, miniaturization of the conductor pattern is required.

Japanese Patent Application Laid-Open No. 2007-81383 discloses a dry etching technology where a lower layer hard mask film is etched using an upper layer hard mask as an etching mask, forming a lower layer hard mask. Then, a film to be etched is dry-etched using the upper layer hard mask and the lower layer hard mask as etching masks.

In the technology according to Japanese Patent Application Laid-Open No. 2007-81383, the upper layer hard mask and the lower layer hard mask are used as etching masks immediately after the start of etching of the film to be etched. The upper layer hard mask is eliminated in the course of etching, and the film to be etched is etched using only the lower layer hard mask as the etching mask immediately before the end of etching. It has been learned that if the mask is changed during the etching process, side-etching may be caused at the side of the film to be etched, or the side may be provided with a slope or irregularities. Such phenomena may cause variations in the width of the conductor pattern, possibly resulting in a decrease in wiring characteristics or reliability.

The present technology is aimed at decreasing conductor pattern width variations.

SUMMARY OF THE INVENTION

According to a first aspect of the present disclosure, a conductor pattern forming method includes forming, on a conductor film, a laminated film including a first layer thinner than the conductor film, a second layer thicker than the first layer, and a third layer thinner than the second layer, which layers are laminated in order from the conductor film side; forming a first mask from the third layer by dry-etching the third layer using a photoresist mask formed on the laminated film via a antireflection film; forming a second mask from the second layer by dry-etching the second layer using the first mask; and removing the first mask and exposing the conductor film by dry-etching the first mask in parallel with the dry-etching of the first layer using the second mask; and forming a conductor pattern from the conductor film by dry-etching the conductor film using the second mask.

According to a second aspect of the present disclosure, a conductor pattern forming method includes forming, on a conductor film including an aluminum layer, a laminated film including a first layer thinner than the conductor film, a second layer thicker than the first layer, and a third layer thinner than the second layer, which layers are laminated in order from the conductor film side; forming a first mask from the third layer by dry-etching the third layer using a photoresist mask formed on the laminated film; forming a second mask from the second layer by dry-etching the second layer using the first mask; removing the first mask and exposing the aluminum layer by dry-etching the first mask in parallel with the dry-etching of the first layer using the second mask; and forming a conductor pattern from the conductor film by dry-etching the conductor film using the second mask.

Further features of the present invention will become apparent from the following description of exemplary embodiments (with reference to the attached drawings).

DESCRIPTION OF THE EMBODIMENTS

In the following, embodiments of the present invention will be described with reference to the drawings. In the following description and drawings, common features through a plurality of views of the drawings will be designated with same reference signs and their description will be omitted whenever appropriate.

FIGS. 1A to 1F-2 are schematic cross sectional views for describing a conductor pattern forming method on a step by step basis.

Figure 1A:
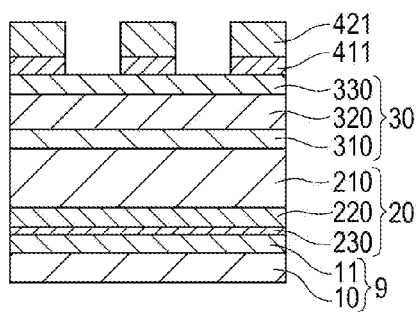
FIGS. 1A to 1F-2 are schematic cross sectional views for describing a conductor pattern forming method.

FIG. 1A illustrates a state after steps A-1, A-2, and A-3.

(Step A-1) First, a conductor film 20 is formed on an insulating substrate 9. The insulating substrate 9 may include a glass substrate with an insulated surface, or even a semiconductor substrate or conductor substrate covered with an insulator. The substrate 9 of the present example includes a semiconductor substrate 10 and an insulator film 11 formed on the semiconductor substrate 10. The surface of the underlying material of the conductor film 20 may not be necessarily entirely formed with an insulator, and the conductor film 20 may be partially in contact with a conductor under the conductor film 20.

The conductor film 20 includes a single-layer film or multilayer film including at least one conductor layer (a first conductor layer 210). The conductor film 20 of the present example further includes a second conductor layer 220 disposed between the substrate 9 and the first conductor layer 210, and a third conductor layer 230 disposed between the second conductor layer 220 and the substrate 9. The first conductor layer 210 provides a major conductor layer of the conductor film 20, and the second conductor layer 220 and the third conductor layer 230 are thinner than the first conductor layer 210. In the following description, the term "thin" means a small thickness and is an antonym of the term "thick".

A conductive pattern forming method according to the present embodiment may be preferably employed when the first conductor layer 210 includes an aluminum layer. The aluminum layer may include not just the single element of aluminum but also an alloy including aluminum as a principal component.

(Step A-2) Then, a laminated film 30 is formed on the conductor film 20. In the present embodiment, the laminated film 30 includes a first layer 310, a second layer 320, and a third layer 330 laminated in that order from the conductor film 20 side. The second layer 320 provides a major layer of the laminated film 30. Preferably, the second layer 320 is thicker than the first layer 310, and preferably the third layer 330 is thinner than the second layer 320. Preferably, the first layer 310 is thinner than the conductor film 20, particularly the first conductor layer 210. Specifically, it is preferable that the relationships T0>T1, T1<T2, and T2>T3 are satisfied, where T0 is the thickness of the conductor film 20, T1 is the thickness of the first layer 310, T2 is the thickness of the second layer 320, and T3 is the thickness of the third layer 330. It is also preferable if the relationship T0>T3 is satisfied.

That the laminated film 30 includes the three separated identifiable layers means that the second layer 320 is made of a material different from both the first layer 310 and the third layer 330. The difference in material offers a technical significance that the etching rate can be varied between the plurality of layers during dry etching of the laminated film 30, as will be described below. The first layer 310, the second layer 320, and the third layer 330 are not particularly limited in terms of conductivity. Preferably, however, the first layer 310 is a conductor layer and the second layer 320 is an insulator layer. The first layer 310 is made of a material different from the first conductor layer 210, which is the upper-most layer of the conductor film 20. At least one of the first layer 310, the second layer 320, and the third layer 330 may be made of the same material as one of the second conductor layer 220 and the third conductor layer 230. For example, the second conductor layer 220 may be made of the same material as the first layer 310, and the second conductor layer 220 may be made of the same material as the third layer 330. Additionally, the third conductor layer 230 may be made of the same material as at least one of the first layer 310, the second layer 320, and the third layer 330. Preferably, the first layer 310 and the third layer 330 may be made of the same material. Thus, the third layer 330 preferably is a conductor layer. The first layer 310, the second layer 320, and the third layer 330 may include an inorganic layer. Alternatively, the first layer 310 and the third layer 330 may be inorganic layers while the second layer 320 may be an organic layer. Examples of the inorganic material may include silicon compounds such as silicon oxide, silicon nitride, and silicon carbide. Examples of the inorganic material may include a metal compound such as metal oxide, metal nitride, or metal carbide. Other examples include silicon or metal oxide nitride, carbide nitride, and carbide oxide. Examples of the organic material include a novolac resist, a polyhydroxystyrene resist, a polyimide resist, and carbon. A carbon layer is classified as an organic layer because the carbon layer can be dry-etched under conditions similar to etching conditions for an organic layer such as the aforementioned resists.

(Step A-3) On the laminated film 30, there is formed an antireflection film for photolithography called bottom antireflective coatings (BARC). Further, on the antireflection film, there is formed a photoresist film. The thickness or material of the photoresist film may be set as needed in accordance with the exposure wavelength. The photoresist film may be formed thicker than the third layer 330, or the photoresist film may be formed thinner than the laminated film 30. The photoresist film may be formed thinner than the conductor film 20. The antireflection film may be formed thinner than the photoresist film. The photoresist film is exposed into a desired pattern by photolithography and then developed, forming a photoresist mask 421 from the photoresist film. By using a short-wavelength exposure light source, such as an ArF excimer laser or a $F_2$ excimer laser, miniaturization can be achieved. The antireflection film (BARC) is patterned using the photoresist mask 421, forming a remaining pattern 411. The antireflection film (BARC) may not be used.

Figure 1B:
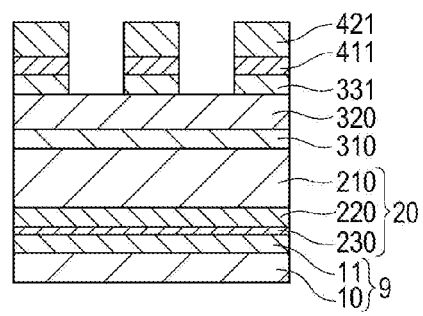

(Step B) FIG. 1B illustrates a state after step B. In step B, the third layer 330 is dry-etched using the photoresist mask 421 as an etch mask, forming a first mask 331 from the third layer 330. In step B, the major purpose is to transfer the pattern of the photoresist mask 421 onto the first mask 331. The pattern of the first mask 331 is a pattern corresponding to the photoresist mask 421.

Preferably, in step B, the third layer 330 is dry-etched under an etching condition such that an etching rate EB3 with respect to the third layer 330 is higher than an etching rate EB2 with respect to the second layer 320. In this way, the second layer 320 functions as an etching stopper during the dry etching of the third layer 330. Preferably, the ratio of the etching rate EB3 for the third layer 330 to the etching rate EB2 for the second layer 320, or etching selectivity (EB3/EB2), is 5 or more.

Figure 1C:
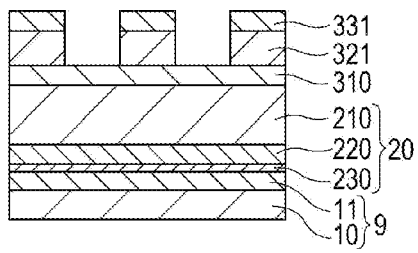

(Step C) FIG. 1C illustrates a state after step C. In step C, the second layer 320 is dry-etched using the first mask 331 as an etch mask, forming a second mask 321 from the second layer 320. The pattern of the second mask 321 is a pattern corresponding to the first mask 331.

Preferably, in step C, the second layer 320 is dry-etched under an etching condition such that an etching rate EC2 with respect to the second layer 320 is higher than an etching rate EC3 with respect to the first mask 331. In this way, a decrease in the thickness of the first mask 331 is suppressed during the dry etching of the second layer 320. Preferably, the ratio of the etching rate EC2 for the second layer 320 to the etching rate EC3 for the first mask 331, or etching selectivity (EC2/EC3), is 5 or more.

Preferably, in step C, the second layer 320 is dry-etched under an etching condition such that the etching rate EC2 for the second layer 320 is higher than the etching rate EC1 for the first layer 310. In this way, the first layer 310 functions as a dry etching stopper during the dry etching of the second layer 320. The ratio of the etching rate EC2 for the second layer 320 to the etching rate EC1 for the first layer 310, or etching selectivity (EC2/EC1), is 5 or more.

Preferably, prior to the dry etching of the second layer 320 in step C, the photoresist mask 421 or the remaining pattern 411 may be removed by ashing. However, in step C, the photoresist mask 421 or the remaining pattern 411 may be present on the first mask 331. The photoresist mask 421 or the remaining pattern 411 can be removed by performing over-dry-etching by extending the etching time during the dry etching of the second layer 320. If the second layer 320 is an organic layer, the photoresist mask 421 or the remaining pattern 411 can also be removed in parallel with the etching of the second layer 320.

Figure 1D:
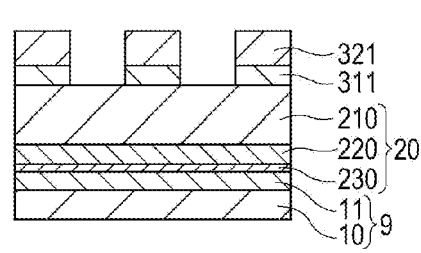

(Step D) FIG. 1D illustrates a state after step D. In step D, the first layer 310 is dry-etched using a second mask to expose the conductor film 20. By dry-etching the first layer 310, a remaining pattern 311 is formed from the first layer 310. At this time, the first mask 331 is removed in parallel with the dry etching of the first layer 310.

Preferably, in step D, the first layer 310 is dry-etched under an etching condition such that an etching rate ED1 with respect to the first layer 310 is higher than an etching rate ED0 with respect to the conductor film 20. In this way, the conductor film 20 functions as an etching stopper during the dry etching of the first layer 310.

Preferably, the ratio of the etching rate ED1 for the first layer 310 to the etching rate ED0 for the conductor film 20, or etching selectivity (ED1/ED0), is 5 or more.

In this step, it is only necessary that the state in which the first layer 310 and the first mask 331 are simultaneously dry-etched continues for a certain period of time. Thus, the start timing for the dry etching of the first layer 310 and the start timing of the dry etching of the first mask 331 may be out of step. Also, the end timing of the dry etching of the first layer 310 and the end timing of the dry etching of the first mask 331 may be out of step. Namely, the timing at which the upper surface of the second mask 321 is exposed as a result of the removal of the first layer 310, and the timing at which the upper surface of the conductor film 20 is exposed as a result of partial removal of the first layer 310 may be different. Preferably, over a half or more of the time from the start to end of the dry etching of the first layer 310, the dry etching of the first mask 331 is performed simultaneously. Preferably, over a half or more of the time from the start to end of the dry etching of the first mask 331, the dry etching of the first layer 310 is simultaneously performed.

Even when the first layer 310 and the first mask 331 have different thicknesses, exposure of the conductor film 20 and removal of the first mask 331 can be performed accurately by performing over-dry-etching by extending the etching time when the first layer 310 and the first mask 331 are dry-etched. Further, even when the first layer 310 and the first mask 331 are made of different materials, the conductor film 20 can be exposed and the first mask 331 can be removed accurately by performing over-dry-etching by extending the etching time. Preferably, however, the first mask 331 (and the third layer 330 used for its formation) and the first layer 310 include the same material or have similar thicknesses. For example, the first layer 310 and the third layer 330 may have a similar thickness range such that the thickness of one of the layers is a half the thickness of the other layer or more and twice the thickness of the other layer or less. Namely, it is preferable that the relationship T1/2<T3<2×T1 is satisfied. In this way, the amount of over-etching can be decreased, suppressing damage to the second mask 321 or the conductor film 20 by over-etching.

Figures 1, 1E:
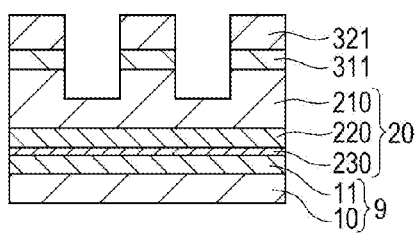

(Step E) FIG. 1E-1 illustrates a state in the course of step E, and (e-2) illustrates a step after step E. In step E, the conductor film 20 is dry-etched using the second mask 321, forming a conductor pattern 21 from the conductor film 20. The conductor pattern 21 is a laminate including the first conductor layer 211 formed from the first conductor layer 210, the second conductor layer 221 formed from the second conductor layer 220, and the third conductor layer 231 formed from the third conductor layer 230.

Preferably, in step E, the conductor film 20 is dry-etched under an etching condition such that an etching rate EE0 with respect to the conductor film 20 is higher than an etching rate EE2 with respect to the second mask 321. In this way, a decrease in the thickness of the second mask 321 can be suppressed when the conductor film 20 is dry-etched. Preferably, the ratio of the etching rate EE0 for the conductor film 20 to the etching rate EE2 for the second mask 321, or etching selectivity (EE0/EE2), is 5 or more.

The second mask 321 is present until the end of etching of the conductor film 20; i.e., until the substrate 9 as the underlying material of the conductor film 20 is exposed. While in the present example, by performing over-etching, the insulator film 11 of the exposed substrate 9 is etched, the etching of the conductor film 20 may be stopped when the substrate 9 is exposed.

Figures 1, 1E, 2:
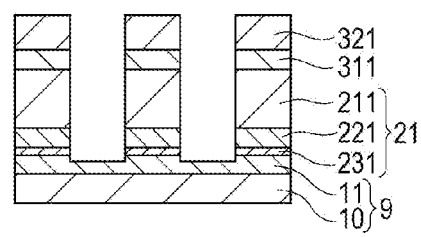
Figures 1, 1F:
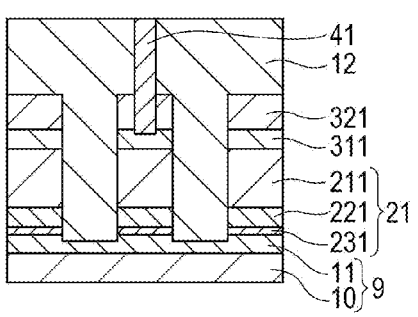
Figures 1, 1F, 2:
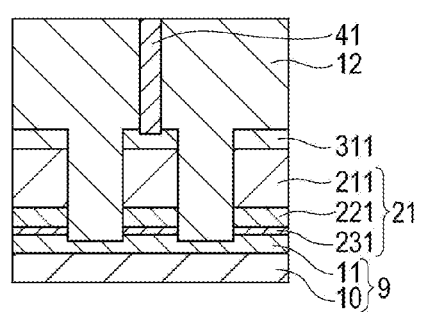

(Step F) FIG. 1F-1 illustrates a state after a first example of step F. FIG. 1F-2 illustrates a state after a second example of step F. Step F includes forming an insulator film 12 covering the conductor pattern 21. Step F also includes forming a conductor member 41 (plug) penetrating the insulator film 12 and electrically connected with the conductor pattern 21.

In the first example of step F, the insulator film 12 covering the conductor pattern 21, the remaining pattern 311, and the second mask 321 is formed with the remaining pattern 311 as part of the first layer 310 and the second mask 321 remaining over the conductor pattern 21. The conductor member 41 can be formed by providing the insulator film 12 with a through-hole and filling the through-hole with a conductor.

In the present example, the conductor member 41 penetrates the second mask 321, which is an insulator, and is in contact with the remaining pattern 311, which is a conductor. The conductor member 41 is electrically connected with the conductor pattern 21 via the remaining pattern 311. If the second mask 321 is a conductor, the conductor member 41 may be electrically connected with the conductor pattern 21 by being contacted with the second mask 321 without penetrating the second mask 321.

The second example of step F further includes removing the second mask 321 prior to the step of forming the insulator film 12. Thereafter, with the remaining pattern 311 as part of the first layer 310 remaining on the conductor pattern 21, the insulator film 12 covering the conductor pattern 21 and the remaining pattern 311 is formed.

In the present example, the conductor member 41 is in contact with the remaining pattern 311, which is a conductor. The conductor member 41 is electrically connected with the conductor pattern 21 via the remaining pattern 311. If the second mask 321 is a conductor, the conductor member 41 may be electrically connected with the conductor pattern 21 by being contacted with the second mask 321 without penetrating the second mask 321.

In step F, not just the second mask 321 but also the remaining pattern 311 may be removed prior to forming the insulator film 12. In that case, the conductor member 41 needs only to be contacted with the conductor pattern 21.

Step F may be omitted so that the conductor pattern 21 is used while being exposed to the external space such as the atmosphere. When the conductor pattern 21 is used for the upper-most layer of a multilayer wiring layer, for example, the conductor member 41 may not be necessary.

Each of the steps will be described.

When the photoresist is patterned in step A, short-wavelength exposure light, such as ArF excimer laser or $F_2$ excimer laser, has a low transmittance with respect to general photoresist material. In order to uniformly expose the photoresist to light from an upper surface to a lower surface thereof, it is necessary to make the photoresist thin.

Attempts at miniaturization of a photoresist pattern may result in an increase in the aspect ratio of the photoresist pattern, possibly causing the fall of the photoresist pattern. The fall of the pattern is often caused during a wet process, such as a developing or washing process. Making the photoresist used in step A thin is also effective against such phenomenon.

However, if the thick conductor film 20 is dry-etched using the thin photoresist pattern as a mask, the photoresist mask may disappear before the end of the dry etching process for the thick conductor film 20. This problem is addressed in step B by transferring the pattern of the photoresist mask 421 onto the thin third layer 330, forming the first mask 331. In this way, even when the thin photoresist mask 421 is used for the purpose of miniaturization during the photoresist patterning in step A, the disappearance of the photoresist mask 421 can be suppressed. Forming the thin first mask 331 also makes it difficult for the fall of the pattern to occur.

In step C, the dry-etching of the thick second layer 320 for forming the second mask 321 is performed such that the first mask 331 remains. In step D, the first layer 310 needs to be dry-etched so as to expose the conductor film 20. At this time, by protecting the second mask 321 with the first mask 331, a dimensional change in the second mask 321 can be suppressed. While the second mask 321 is thick, forming the second mask 321 by dry etching can better suppress the pattern falling than by a wet process as when the photoresist pattern is formed.

In step D, when the first mask 331 is removed, the first layer 310 can function as a protection layer for the conductor film 20. If the first layer 310 is absent, there is the possibility that the conductor film 20 could be etched when the first mask 331 is removed. Also, if the etching of the second mask 321 is started after the first layer 310 is dry-etched and the conductor film 20 is exposed, side-etching may proceed for the remaining pattern 311 formed from the first layer 310. If side-etching is caused in the remaining pattern 311, under-etching of the conductor film 20 may be caused in step E under the second mask 321, providing an unfavorable influence to the shape of the conductor pattern 21.

By removing the first mask 331 and the first layer 310 in parallel, damage to both the second mask 321 and the conductor film 20 can be decreased.

In step E, when the thick first conductor layer 210 is dry-etched, the thick second mask 321 is used instead of the thin first mask 331. If both the first mask 331 and the second mask 321 are used during the dry etching of the first conductor layer 210, there is the possibility that the first mask 331 may be eliminated in the course of dry etching of the first conductor layer 210. This means that the dimensions of the first mask 331 may be changed during the dry etching of the first conductor layer 210, and that the mask material is switched in the course of the dry etching of the first conductor layer 210. Such changes cause side-etching in the first conductor layer 210, causing variations in the dimensions of the conductor pattern 21. This is due to the following reason. The side-etching can be suppressed by protecting a sidewall formed on the first conductor layer 210 in the course of dry etching of the first conductor layer 210 with a protection film. The sidewall protection film is considered to include three components, i.e., a first component, a second component, and a third component. The first component is a component deriving from a product of a reaction of the first conductor layer 210 and the etching gas for the first conductor layer 210. The second component is a component deriving from a product of a reaction of the first mask or the second mask and the etching gas for the first conductor layer 210. The third component is a component deriving from a deposited material of deposition gas for the sidewall protection. Of the three components of the protection film, a change in the mask material causes a change in the second component. As a result, the thickness or etching resistance of the protection film is changed, whereby the degree of side-etching of the first conductor layer 210 is changed. This is considered to be a factor causing variations in the dimensions of the conductor pattern 21. According to the present embodiment, the first mask 331 is removed in step D in advance so as to suppress the mask switching in step E.

The present embodiment is particularly effective when the layers of the conductor film 20 other than the first conductor layer 210 (such as the second conductor layer 220) are made of the same material as the remaining pattern 311 or the first mask 331. This is because the conductor film 20 (second conductor layer 220) needs to be etched under an etching condition such that the remaining pattern 311 or the first mask 331 can be etched. Because the first mask 331 is removed in advance, the switching of the first mask 331 to the second mask 321 in the course of etching of the conductor film 20 can be avoided. Further, by making the first layer 310 thinner than the second layer 320, the influence of side-etching of the remaining pattern 311 during the etching of the layers other than the first conductor layer 210 of the conductor film 20 can be decreased.

With reference to FIG. 2, an example of application of the above-described conductor pattern forming method to a photoelectric conversion device will be described. Copper wiring commonly used in semiconductor devices requires a diffusion prevention layer for the copper, where a laminate structure of an interlayer insulation layer and the diffusion prevention layer creates a factor for degrading optical characteristics. Further, even when the diffusion prevention layer is provided, there remains the possibility of contamination by copper diffusion. Thus, in a photoelectric conversion device, it is preferable to use aluminum wiring. Obviously, the above-described conductor pattern forming method may be applied to semiconductor devices other than the photoelectric conversion device or to electronic devices other than semiconductor devices.

In the photoelectric conversion device, as the number of wires increases as a result of an increase in the number of pixels and the like, it is required to form finer aluminum wiring. Particularly, in a photoelectric conversion device such that one pixel is provided with a plurality of photoelectric conversion units for focus detection, it is necessary to at least double the number of wires even for the same, conventional number of pixels so as to read signals from the plurality of photoelectric conversion units.

Aluminum wiring has higher resistivity than copper wiring. Thus, if the wiring has a finer portion due to manufacturing variations, operation may be destabilized or the wiring may become fractured. Accordingly, the patterning process for aluminum wiring miniaturization requires very high reliability.

The present embodiment provides a highly advantageous technology for aluminum wiring miniaturization. Namely, the switching of masks during the dry etching of the aluminum layer is made difficult to occur, whereby variations in the aluminum wiring width are not readily caused, providing a highly reliable method for wiring formation.

Figure 2A:
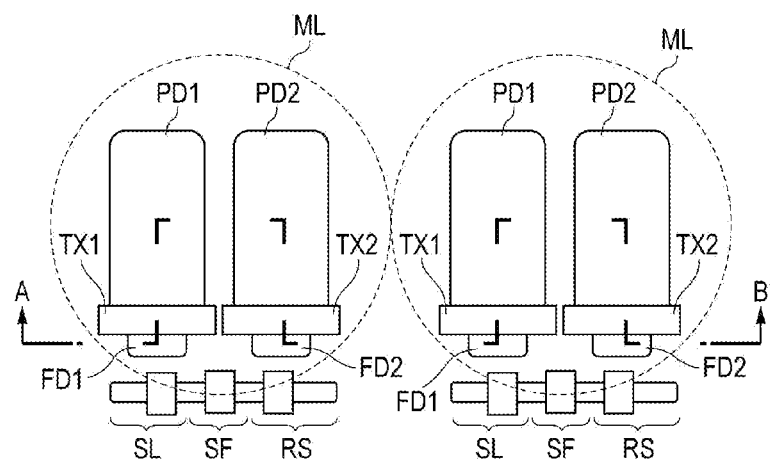
FIGS. 2A to 2B are schematic views for describing an example of a semiconductor device.

FIG. 2A is a schematic plan view of a pixel array in which pixels enabling focus detection are arranged. Each of the pixels in the pixel array includes a plurality of photodiodes including a first photodiode PD1 and a second photodiode PD2. The photodiodes of each pixel constitute a photodiode array of a plurality of photodiodes. In the illustrated example, four photodiodes including two pixels are illustrated. Between the first photodiode PD1 and the second photodiode PD2 of each pixel, a first isolation region S1 including junction isolation or dielectric isolation is provided. In the present example, the first isolation region S1 is a p-type impurity region which is of the opposite conductive type to n-type accumulation regions of the first photodiode PD1 and the second photodiode PD2. Between adjacent pixels, a second isolation region S2 including junction isolation or dielectric isolation is provided. A signal charge produced by the first photodiode PD1 is transferred via a first transfer gate TX1 to a first floating diffusion region FD1. A signal charge produced by the second photodiode PD2 is transferred via a second transfer gate TX2 to a second floating diffusion region FD2. Signals corresponding to the potentials of the first floating diffusion region FD1 and the second floating diffusion region FD2 are generated by an amplifier device SF and output via a selection device SL. The potentials of the first floating diffusion region FD1 and the second floating diffusion region FD2 are reset by a reset device RS. Signals based on the potential of the first floating diffusion region FD1 and the potential of the second floating diffusion region FD2 may be output by a time-division system. The amplifier device SF corresponding to the first floating diffusion region FD1 and the amplifier device SF corresponding to the second floating diffusion region FD2 may be separately provided.

Figure 2B:
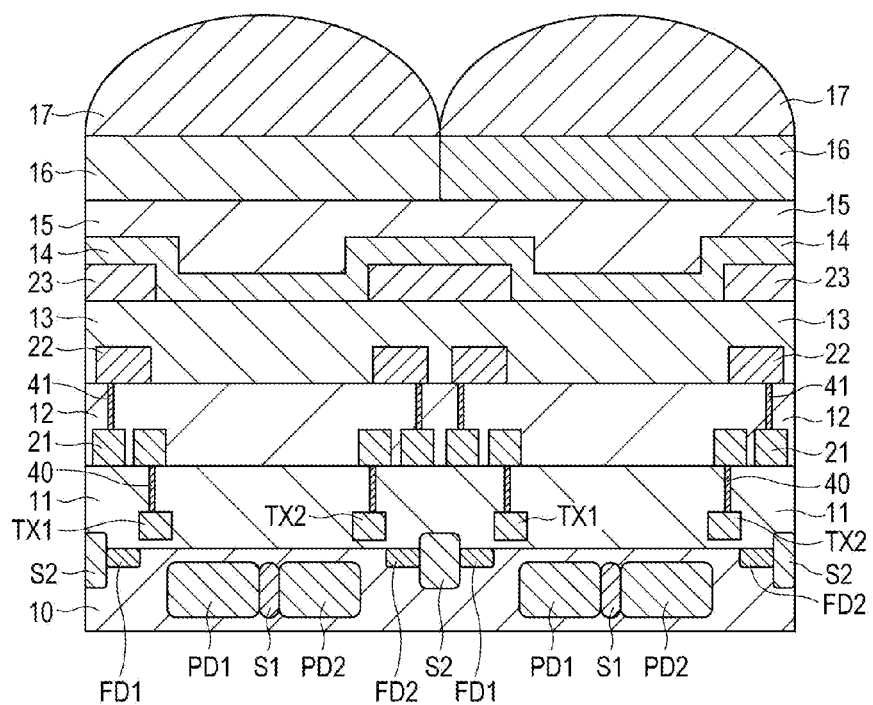

FIG. 2B is a schematic cross sectional view of the pixel array taken along line A-B of FIG. 2A. Between a first insulator film 11 and a second insulator film 12, a first conductor pattern 21 including a wiring layer is provided. Between the second insulator film 12 and the third insulator film 13, a second conductor pattern 22 including a wiring layer is provided. Over the third insulator film 13, a third conductor pattern 23 including a light shielding layer is formed. The third conductor pattern 23 is covered with a passivation film 14. Over the passivation film 14, a planarizing film 15, a color filter 16, and a microlens 17 are provided. The microlenses of the respective pixels constitute a microlens array of a plurality of arranged microlenses. In the illustrated example, two microlenses for the two pixels are illustrated. Thus, the number of the photodiodes included in the photodiode array is greater (e.g. twice) than the number of the microlenses included in the microlens array. The color filters of the respective pixels constitute a color filter array of a plurality of arranged color filters. In the illustrated example, two color filters for the two pixels are illustrated. Thus, the number of the photodiodes included in the photodiode array is greater (e.g. twice) than the number of the color filters included in the microlens array. In FIG. 2A, dotted lines ML indicate one contour line of each microlens 17. Light incident on the microlens 17 becomes incident on at least one of the first photodiode PD1 and the second photodiode PD2. In each pixel, focus detection can be performed by a phase difference detection system based on a difference in the amount of charge produced by the first photodiode PD1 and the second photodiode PD2.

When each pixel is provided with a plurality of photodiodes as described above, the number of wires is increased. Thus, it is necessary to miniaturize the first conductor pattern 21 or the second conductor pattern 22 including the wiring layers. For miniaturizing the first conductor pattern 21 or the second conductor pattern 22 disposed between the microlens array and the photodiode array (i.e. between the color filter array and the photodiode array), it is advantageous to adopt the conductor pattern forming method described with reference to FIG. 1. Obviously, the conductor pattern forming method described with reference to FIG. 1 may also be adopted for the third conductor pattern 23.

The first layer 310 may include a titanium nitride layer, and the insulator film 12 may be formed with the titanium nitride layer remaining on the conductor pattern 21 as the remaining pattern 311, as illustrated in FIG. 1F-1 or FIG. 1F-2. In this way, the titanium nitride layer disposed on the conductor pattern 21 can function as an antireflection film that suppresses reflection on the upper surface of the conductor pattern 21. When the first conductor layer 211 forming the upper surface of the conductor pattern 21 is formed by an aluminum layer with high reflectivity, reflection of the incident light on the upper surface can be decreased, whereby stray light can be suppressed and good image quality can be obtained.

The photoelectric conversion device may be further provided with a package for housing the semiconductor substrate. The package may include a substrate to which the semiconductor substrate is affixed, a cover member disposed opposite the semiconductor substrate, and a connection member for exchanging signals with the outside.

Using the photoelectric conversion device, an imaging system may be constructed. The imaging system may include an information terminal including a camera or photography function. The imaging system may be provided with a signal processing means for processing a signal obtained from the photoelectric conversion device, and a display means for displaying an image photographed by the photoelectric conversion device.

The foregoing embodiment may be variously modified as needed without departing from the concept of the present invention.

FIRST EXAMPLE

With reference to FIG. 1, a first example will be described, citing concrete materials and etching conditions.

In the present example, the first conductor layer 210 is an aluminum layer with a thickness of 150 to 400 nm; the second conductor layer 220 is a titanium nitride layer with a thickness of 5 to 50 nm; and the third conductor layer 230 is a titanium layer with a thickness of 0 to 30 nm. The aluminum layer of the present example includes an aluminum-copper alloy containing 100-X % of aluminum and X % ($0 \leq X \leq 5$) of copper. The conductor film 20 has a thickness of 155 to 480 nm.

In the present example, the first layer 310 is a titanium nitride layer with a thickness of 10 to 100 nm; the second layer 320 is a silicon oxide layer with a thickness of 150 to 400 nm; and the third layer 330 is a titanium nitride layer with a thickness of 10 to 100 nm.

The silicon oxide layer of the second layer 320 may have a crystal structure, such as a single crystal or polycrystalline structure, or an amorphous structure. The silicon oxide layer may also include silicate glass, such as boron phosphorus silicon glass (BPSG), or silica glass, such as spin-on glass (SOG).

In the present example, for the photolithographic exposure in step A for forming the remaining pattern 411, an ArF excimer laser (oscillation wavelength 193 nm) may be used as the exposure light source. The photoresist film material may be selected in accordance with the exposure light. The photoresist mask 421 may have a thickness on the order of 100 to 200 nm, and a pattern width on the order of 65 to 120 nm.

In the present example, the third layer 330 may be dry-etched in step B under the following etching conditions. The process gas pressure refers to the total pressure of the gas in the chamber of a plasma etching device.

Process gas pressure: 3 to 20 mTorr
High-frequency source power: 400 to 1000 W
RF bias power: 0 to 500 W
$BCl_3$ gas flow rate: 0 to 50 sccm
$Cl_2$ gas flow rate: 50 to 150 sccm
$N_2$ gas flow rate: 0 to 30 sccm
$C_2H_4$(30%)-He(70%) mixture gas flow rate: 10 to 40 sccm In the present example, the second layer 320 may be dry-etched in step C under the following etching conditions, for example.

Process gas pressure: 3 to 20 mTorr
High-frequency source power: 100 to 1000 W
RF bias power: 500 to 2000 W
$CF_4$ gas flow rate: 20 to 200 sccm CHF$_3$ gas flow rate: 0 to 100 sccm
O$_2$ gas flow rate: 5 to 40 sccm
Ar gas flow rate: 0 to 800 sccm As the etching gas for the silicon oxide for which titanium nitride functions as a dry etching stopper, oxygen-containing gas or fluorine-containing gas may be used. As the fluorine-containing gas, fluorocarbon gases, such as CH$_2$F$_2$, C$_2$F$_6$, C$_4$F$_8$, C$_5$F$_8$, and C$_4$F$_6$, as well as CF$_4$ and CHF$_3$, may be used. Under the above etching conditions, the etching selectivity of the second layer 320 including silicon oxide with respect to the first mask 331 and the first layer 310 including titanium nitride is 25 or more.

In the present example, the first mask 331 and the first layer 310 may be dry-etched in step D under the following etching conditions, for example.

Process gas pressure: 3 to 10 mTorr
High-frequency source power: 1000 to 1800 W
RF bias power: 0 to 200 W
Cl$_2$ gas flow rate: 30 to 200 sccm
CHF$_3$ gas flow rate: 0 to 50 sccm Under the above etching conditions, the etching selectivity of the titanium nitride layer (first layer 310) and the aluminum layer (first conductor layer 210) is 10 or more.

For etching the titanium nitride layer, mainly chlorine-containing gas is used and, additionally, process gas to which fluorine-containing gas is added is used. The chlorine-containing gas reacts with titanium nitride, producing titanium chloride. The fluorine-containing gas reacts with aluminum, producing aluminum fluoride. The boiling point of titanium chloride is 136° C., and the boiling point of aluminum fluoride is 1291° C. The higher the volatility of the reaction product of a film to be etched and etching gas, the more easily the film to be etched is etched. Thus, the etching rate of the film to be etched increases as the boiling point of the reaction product becomes lower. This means that, by using the chlorine-containing gas and fluorine-containing gas in step D, there is satisfied an etching condition such that the titanium nitride layer is easily etched but the aluminum layer is not easily etched. In the present example, the material of both the first mask 331 and the first layer 310 is titanium nitride, so that etching for both can be virtually simultaneously completed. Thus, side-etching of the remaining pattern 311 can be suppressed.

The boiling point of aluminum chloride as the reaction product of chlorine-containing gas and aluminum is 183° C. Thus, the aluminum layer is easily etched by chlorine-containing gas by itself. The etching can be prevented by adding fluorine-containing gas to the chlorine-containing gas so as to produce aluminum fluoride as a reaction product on the surface of the aluminum layer. In this way, the aluminum layer of the conductor film 20 can be protected from side-etching.

In the present example, the material of the first layer 310 and the third layer 330 is titanium nitride. However, instead of titanium nitride, titanium, tungsten, tantalum, titanium oxynitride (TiON), or titanium aluminum nitride (TiAlN) may be used under similar conditions.

In the present example, the conductor film 20 may be dry-etched in step E under the following etching conditions, for example.

Process gas pressure: 3 to 10 mTorr
High-frequency source power: 200 to 800 W
RF bias power: 200 to 600 W
BCl$_3$ gas flow rate: 20 to 100 sccm
Cl$_2$ gas flow rate: 50 to 200 sccm
N$_2$ gas flow rate: 0 to 20 sccm
C$_2$H$_4$(30%)-He(70%) mixture gas flow rate: 0 to 20 sccm The BCl$_3$ gas and Cl$_2$ gas act as the above-described etching gas, and produce aluminum chloride as a first component. The Cl$_2$ gas and N$_2$ gas act as the above-described sidewall protection gas for the aluminum layer, and produces an organic polymer as a third component.

SECOND EXAMPLE

With reference to FIG. 1, a second example will be described, citing concrete materials and etching conditions.

The present example differs from first example in that the second layer 320 is a carbon layer with a thickness of 150 to 600 nm. The present example is similar to the first example in the configuration of the conductor film 20 and the configurations other than that of the second layer 320 of the laminated film 30.

The carbon layer of the second layer 320 may be formed as a coated carbon film by providing a coat of liquid in which carbon particles are dispersed in an organic binder. Alternatively, the carbon layer film may be formed by sputtering.

The third layer 330 may be dry-etched in step B under etching conditions similar to those of the first example.

In the present example, the second layer 320 may be dry-etched in step C under the following etching conditions, for example.

Process gas pressure: 10 to 50 mTorr
High-frequency source power: 500 to 1800 W
RF bias power: 200 to 1000 W
H$_2$ gas flow rate: 100 to 300 sccm
N$_2$ gas flow rate: 300 to 1000 sccm The second layer 320 including a carbon layer may be dry-etched using nitrogen- and hydrogen-containing gas. Under the etching conditions, the etching selectivity of the second layer 320, which is a carbon layer, and the first layer 310, which is a titanium nitride layer, is 100 or more.

The first mask 331 and the first layer 310 may be dry-etched in step D under etching conditions similar to those of the first example.

In the present example, the conductor film 20 may be dry-etched in step E under the following etching conditions, for example.

Process gas pressure: 3 to 10 mTorr
High-frequency source power: 200 to 800 W
RF bias power: 200 to 600 W
BCl$_3$ gas flow rate: 20 to 100 sccm
Cl$_2$ gas flow rate: 50 to 200 sccm
N$_2$ gas flow rate: 0 to 20 sccm
C$_2$H$_4$(30%)-He(70%) mixture gas flow rate: 0 to 20 sccm For removing the second mask 321, the following etching conditions may be adopted, for example.

Process gas pressure: 50 to 500 mTorr
High-frequency source power: 500 to 2000 W
RF bias power: 0 to 500 W
O$_2$ gas flow rate: 500 to 3000 sccm
H$_2$O gas flow rate: 0 to 3000 sccm According to the present example, variations in the conductor pattern width can be decreased.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-255211, filed Dec. 10, 2013, which is hereby incorporated by reference herein in its entirety.

What is claimed is:

1. A conductor pattern forming method comprising:
forming, on a conductor film, a laminated film including a first layer thinner than the conductor film, a second layer thicker than the first layer, and a third layer thinner than the second layer, which layers are laminated in this order from the conductor film side;
forming a first mask from the third layer by dry-etching the third layer using a photoresist mask formed on the laminated film via a antireflection film;
forming a second mask from the second layer by dry-etching the second layer using the first mask;
removing the first mask and exposing the conductor film by dry-etching the first mask in parallel with dry-etching of the first layer using the second mask; and
forming a conductor pattern from the conductor film by dry-etching the conductor film using the second mask,
wherein the conductor film includes a first conductor layer thicker than the first layer, and a second conductor layer disposed under the first conductor layer and thinner than the first conductor layer, and
wherein at least one of the first layer and the third layer comprise the same material as the second conductor layer.

2. The conductive pattern forming method according to claim 1, wherein the dry etching of the first layer is performed under an etching condition such that an etching rate with respect to the first layer is higher than an etching rate with respect to the conductor film.

3. The conductive pattern forming method according to claim 1, wherein
the first layer is a conductor layer, and
the second layer is an insulator layer.

4. The conductive pattern forming method according to claim 1, wherein the first layer and the third layer comprise the same material.

5. The conductive pattern forming method according to claim 1, wherein the second layer and the third layer are inorganic layers.

6. The conductive pattern forming method according to claim 1, wherein the conductor film includes an aluminum layer thicker than the first layer, and the first layer is a titanium nitride layer.

7. The conductive pattern forming method according to claim 1, comprising forming an insulator film covering the conductor pattern and the first layer, with the first layer remaining on the conductor pattern.

8. A method of manufacturing a semiconductor device method comprising forming a wiring using the conductive pattern forming method according to claim 1.

9. A method of manufacturing a semiconductor device including a photodiode array, a color filter array, and a wiring disposed between the photodiode array and the color filter array, wherein the number of photodiodes included in the photodiode array is greater than the number of color filters included in the lens array,
the method comprising forming the wiring using the conductive pattern forming method according to claim 1.

10. A conductor pattern forming method comprising:
forming, on a conductor film including an aluminum layer, a laminated film including a first layer thinner than the conductor film, a second layer thicker than the first layer, and a third layer thinner than the second layer, which layers are laminated in this order from the conductor film side;
forming a first mask from the third layer by dry-etching the third layer using a photoresist mask formed on the laminated film;
forming a second mask from the second layer by dry-etching the second layer using the first mask;
removing the first mask and exposing the aluminum layer by dry-etching the first mask in parallel with the dry-etching of the first layer using the second mask;
forming a conductor pattern from the conductor film by dry-etching the conductor film using the second mask; and
forming an insulator film covering the conductor pattern, the first layer, and the second mask, with the first layer and the second mask remaining on the conductor pattern.

11. The conductive pattern forming method according to claim 10, wherein the dry etching of the first layer is performed under an etching condition such that an etching rate with respect to the first layer is higher than an etching rate with respect to the conductor film.

12. The conductive pattern forming method according to claim 10, wherein
the first layer is a conductor layer, and
the second layer is an insulator layer.

13. The conductive pattern forming method according to claim 10, wherein the first layer and the third layer comprise the same material.

14. The conductive pattern forming method according to claim 10, wherein the second layer and the third layer are inorganic layers.

15. A conductor pattern forming method comprising:
forming, on a conductor film, a laminated film including a first layer thinner than the conductor film, a second layer thicker than the first layer, and a third layer thinner than the second layer, which layers are laminated in this order from the conductor film side;
forming a first mask from the third layer by dry-etching the third layer using a photoresist mask formed on the laminated film via a antireflection film;
forming a second mask from the second layer by dry-etching the second layer using the first mask;
removing the first mask and exposing the conductor film by dry-etching the first mask in parallel with dry-etching of the first layer using the second mask;
forming a conductor pattern from the conductor film by dry-etching the conductor film using the second mask; and
forming an insulator film covering the conductor pattern, the first layer, and the second mask, with the first layer and the second mask remaining on the conductor pattern.

16. The conductive pattern forming method according to claim 15, wherein
the conductor film includes a first conductor layer thicker than the first layer, and a second conductor layer disposed under the first conductor layer and thinner than the first conductor layer, and
at least one of the first layer and the third layer comprise the same material as the second conductor layer.

17. A method of manufacturing a semiconductor device comprising forming a wiring using the conductive pattern forming method according to claim 15.

18. A method of manufacturing a semiconductor device including a photodiode array, a lens array, and a wiring disposed between the photodiode array and the lens array, wherein the number of photodiodes included in the photodiode array is greater than the number of lenses included in the lens array, the method comprising forming the wiring using the conductive pattern forming method according to claim 15.

* * * * *